(12) United States Patent
Snider

(10) Patent No.: US 7,358,614 B2
(45) Date of Patent: Apr. 15, 2008

(54) ANTISYMMETRIC NANOWIRE CROSSBARS

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 16 days.

(21) Appl. No.: 11/079,763

(22) Filed: Mar. 8, 2005

(65) Prior Publication Data

US 2006/0202358 A1 Sep. 14, 2006

(51) Int. Cl.
*H01L 23/48* (2006.01)
*H01L 23/52* (2006.01)
*H01L 29/40* (2006.01)

(52) U.S. Cl. ...................... 257/776; 977/762
(58) Field of Classification Search ............... 257/784, 257/758, 776; 977/762
See application file for complete search history.

(56) References Cited

U.S. PATENT DOCUMENTS

| 6,880,146 | B2* | 4/2005 | Snider | 716/17 |
| 7,049,626 | B1* | 5/2006 | Chen | 257/9 |
| 2003/0200521 | A1* | 10/2003 | DeHon et al. | 716/16 |
| 2004/0150010 | A1* | 8/2004 | Snider | 257/209 |
| 2004/0151211 | A1* | 8/2004 | Snider | 370/534 |
| 2005/0017234 | A1* | 1/2005 | DeHon et al. | 257/9 |
| 2006/0087344 | A1* | 4/2006 | Snider et al. | 326/101 |
| 2006/0121670 | A1* | 6/2006 | Stasiak | 438/237 |
| 2006/0129340 | A1* | 6/2006 | Straznicky | 702/65 |
| 2006/0161876 | A1* | 7/2006 | DeHon et al. | 716/17 |
| 2006/0172521 | A1* | 8/2006 | Snider | 438/597 |
| 2006/0189112 | A1* | 8/2006 | Chen et al. | 438/597 |
| 2006/0190896 | A1* | 8/2006 | Snider | 716/12 |

OTHER PUBLICATIONS

Snider, Greg et al., CMOS-like logic in defective, nanoscale crossbars, Institute of Physics Publishing, Jun. 9, 2004, pp. 881-891.
Stewart, Duncan—"Nano Architectures I: Crossbar Circuits"—Internet Article—Aug. 13, 2004—pp. 3-56.
Weaver, Nicholas et al—"The SFRA: A Corner-Turn FPGA Architecture" FPGA International Symposium—vol. 12 2004—pp. 3-12.

\* cited by examiner

*Primary Examiner*—S. V. Clark

(57) ABSTRACT

Various embodiments of the present invention are directed to antisymmetric nanowire-crossbar-circuit designs. Antisymmetric nanowire crossbars are composed, in certain embodiments of the present invention, of two or more microregions that receive input signals and two or more microregions that send output signals. Antisymmetric nanowire crossbars may include a nanowire-crossbar network having signal paths that carry signals between one or more of the microregions. The nanowire-crossbar network may also carry signals between external electronic devices and one or more of the microregions. Antisymmetric nanowire crossbars may additionally include two or more structures that supply voltage and ground.

8 Claims, 13 Drawing Sheets

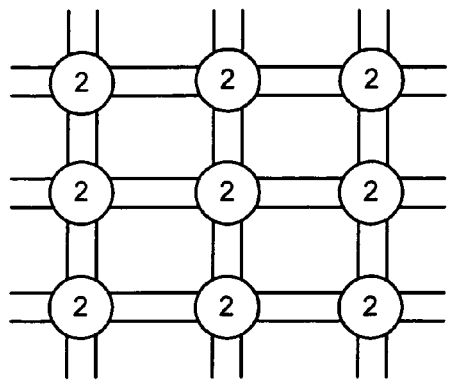
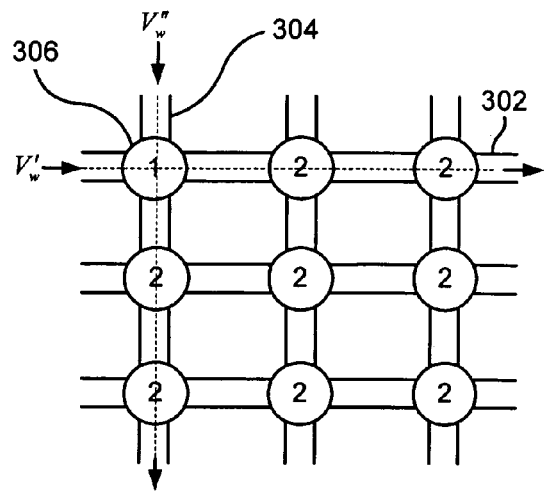
*Figure 3A*  *Figure 3B*
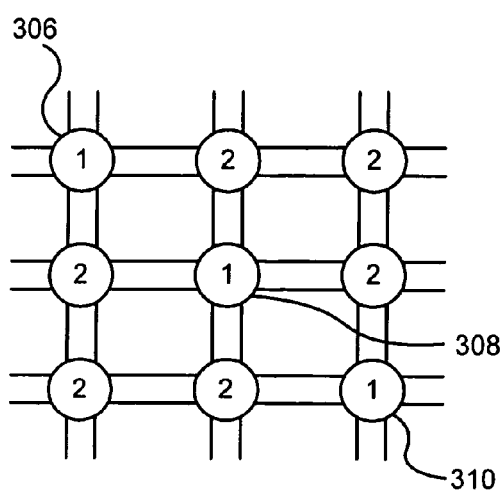
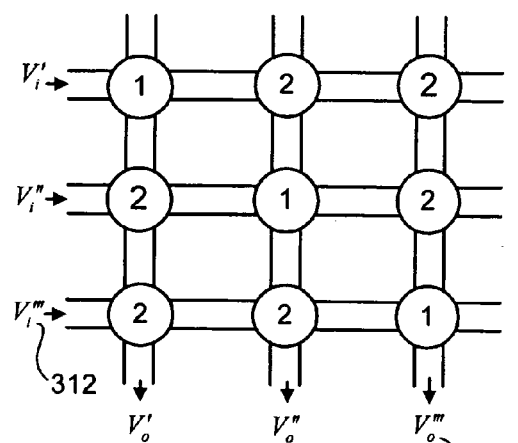
*Figure 3C*  *Figure 3D*

| A | B | AB | C | AB+C | $\overline{AB+C}$ |
|---|---|----|---|------|-------------------|
| 0 | 0 | 0  | 0 | 0    | 1                 |
| 0 | 0 | 0  | 1 | 1    | 0                 |
| 0 | 1 | 0  | 0 | 0    | 1                 |
| 0 | 1 | 0  | 1 | 1    | 0                 |
| 1 | 0 | 0  | 0 | 0    | 1                 |
| 1 | 0 | 0  | 1 | 1    | 0                 |
| 1 | 1 | 1  | 0 | 1    | 0                 |
| 1 | 1 | 1  | 1 | 1    | 0                 |

← 503

1

ANTISYMMETRIC NANOWIRE CROSSBARS

TECHNICAL FIELD

The present invention relates to electronic devices, and, in particular, to nanoscale crossbar designs that reduce the surface area and the amount of routing circuitry needed to fabricate nanoscale crossbar electronic devices.

BACKGROUND OF THE INVENTION

During the past fifty years, the electronics and computing industries have been relentlessly propelled forward by ever decreasing sizes of basic electronic components, such as transistors and signal lines, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Expensive semiconductor fabrication facilities may need to be rebuilt in order to use the new techniques. Many new obstacles are also expected to be encountered. For example, it is necessary to fabricate semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating submicroscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Nanoscale electronic devices can be made by selectively fabricating simple electronic components, such as conductors, transistors, resistors, diodes, and other components, in the gap between overlapping nanowires. When designing nanoscale electronic devices, designers and manufacturers typically try to decrease the amount of signal wire needed to transmit signals between devices, to decrease the surface area of the devices, and reduce the amount of time needed to transmit signals between devices. However, current methods by which nanowire circuitry is manufactured are not amenable to simple miniaturization. Instead, designers, manufacturers, and users of nanoscale electronic devices have recognized the need for new nanoscale electronic devices with reduced the amounts of signal wire and surface area, and increased speeds of signal transmission.

SUMMARY OF THE INVENTION

Various embodiments of the present invention are directed to antisymmetric nanowire-crossbar-circuit designs. Antisymmetric nanowire crossbars are composed, in certain embodiments of the present invention, of two or more microregions that receive input signals and two or more microregions that send output signals. Antisymmetric nanowire crossbars may include a nanowire-crossbar network having signal paths that carry signals between one or more of the microregions. The nanowire-crossbar network may also carry signal paths between external electronic devices and one or more of the microregions.

DETAILED DESCRIPTION OF THE DRAWINGS

FIGS. 3A-3D illustrate one possible approach for configuring a network of nanoscale electrical components from a two-layer nanowire crossbar.

FIGS. 4A-4F schematically illustrate a number of simple electrical components that can be programmed at the nanowire junctions of nanowires in nanowire crossbars.

Figures 5A, 5B:
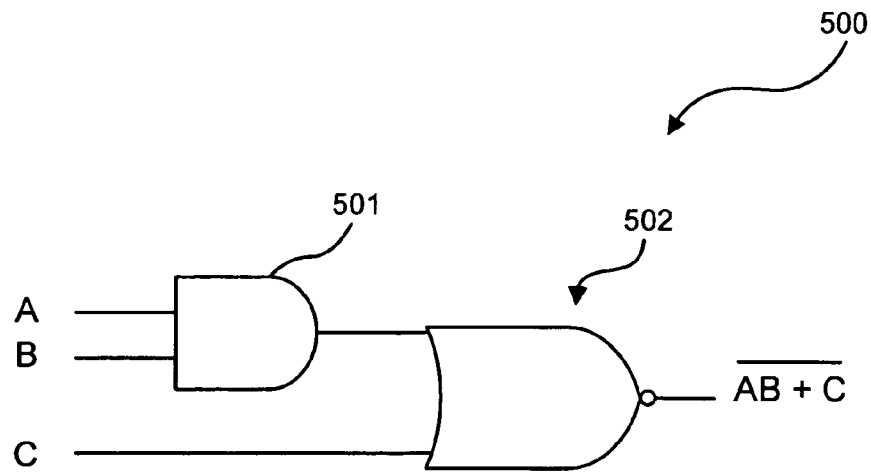

FIG. 5A illustrates an exemplary logic circuit.

FIG. 5B illustrates a table that summarizes the output of the logic circuit shown in FIG. 5A.

Figure 6:
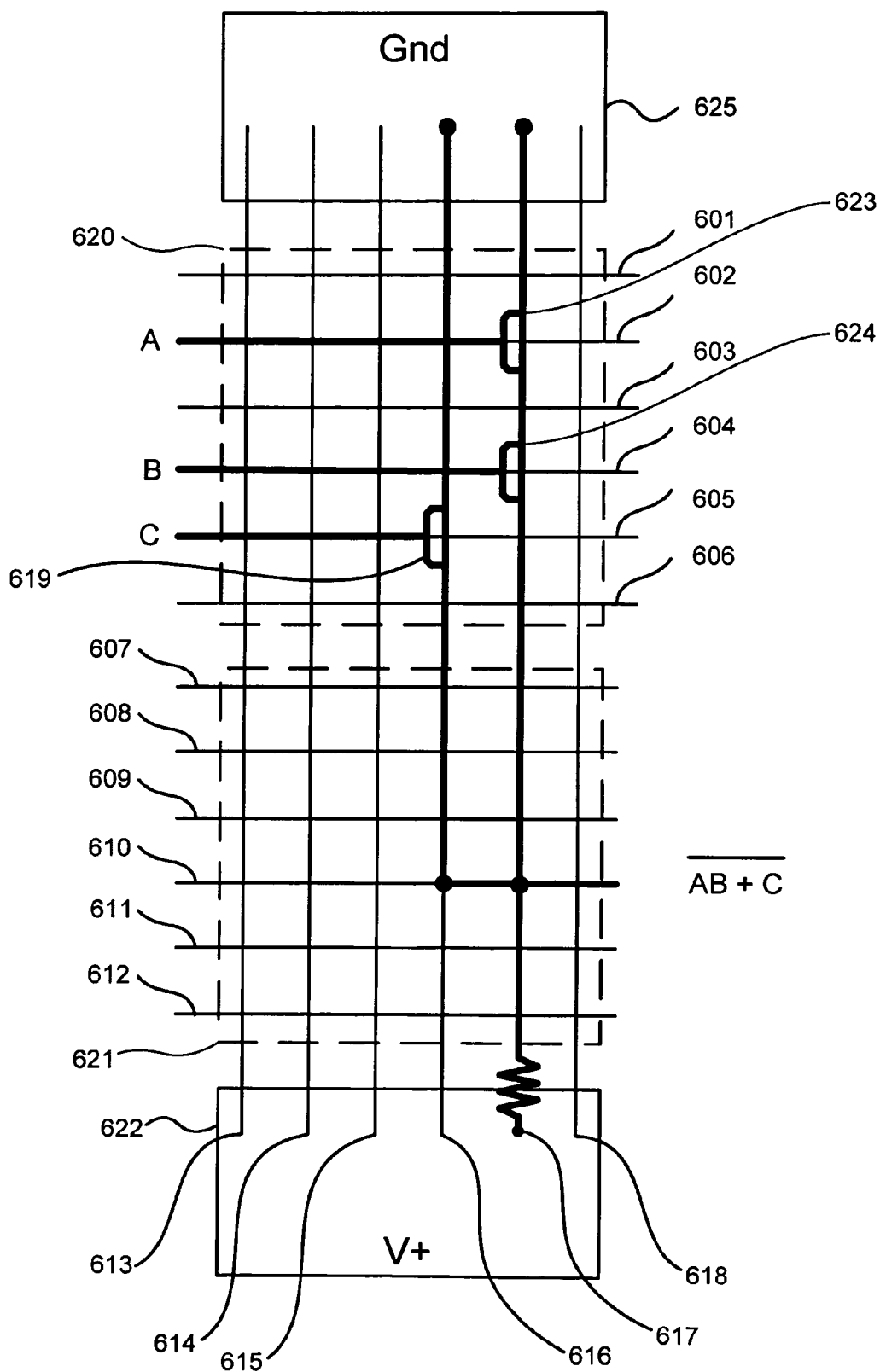

FIG. 6 illustrates one of many possible exemplary nanowire-crossbar-logic circuits that can be used to implement the logic circuit shown in FIG. 5A.

Figure 7:
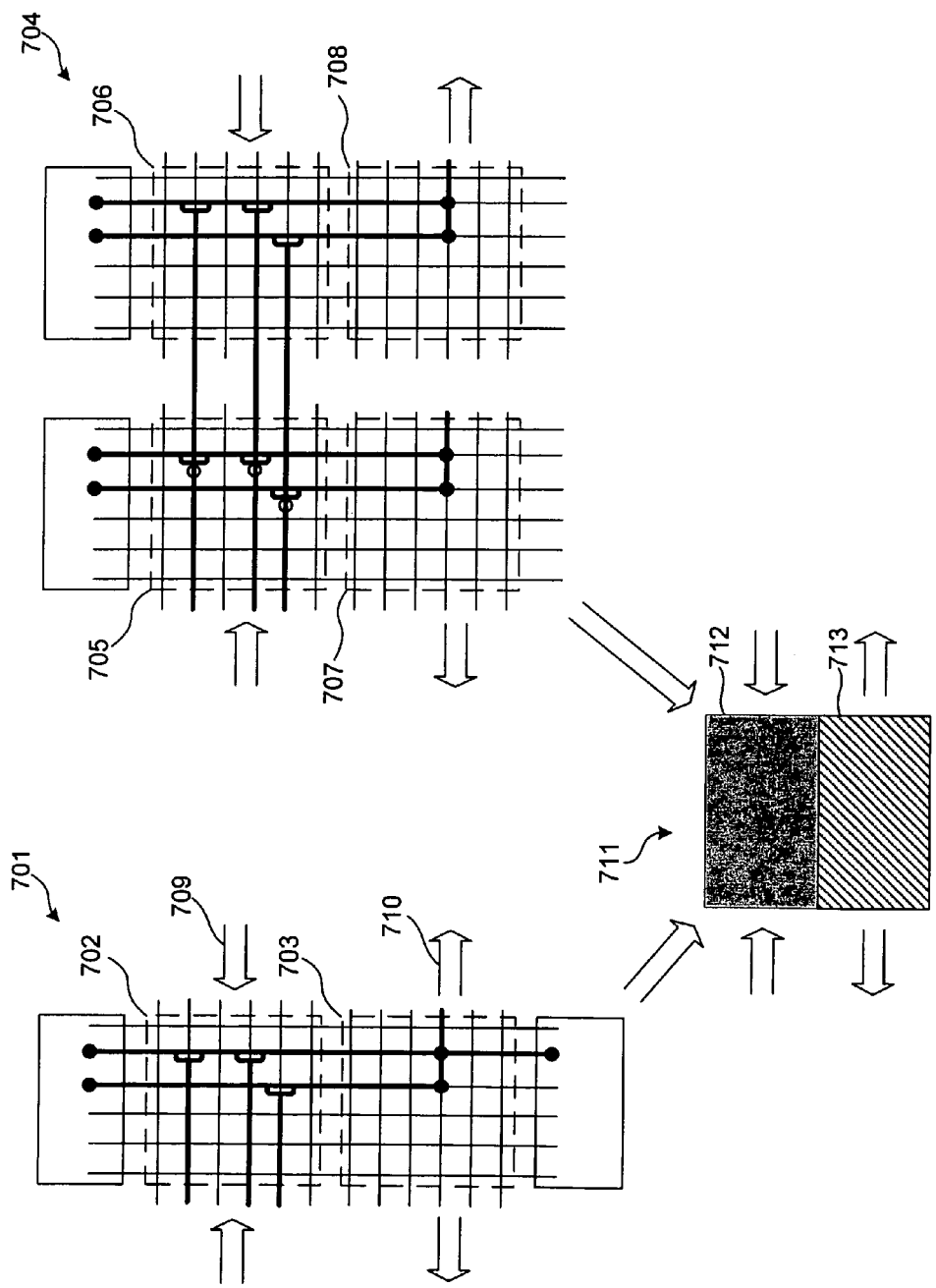

FIG. 7 shows a generalized nanowire crossbar.

Figure 8:
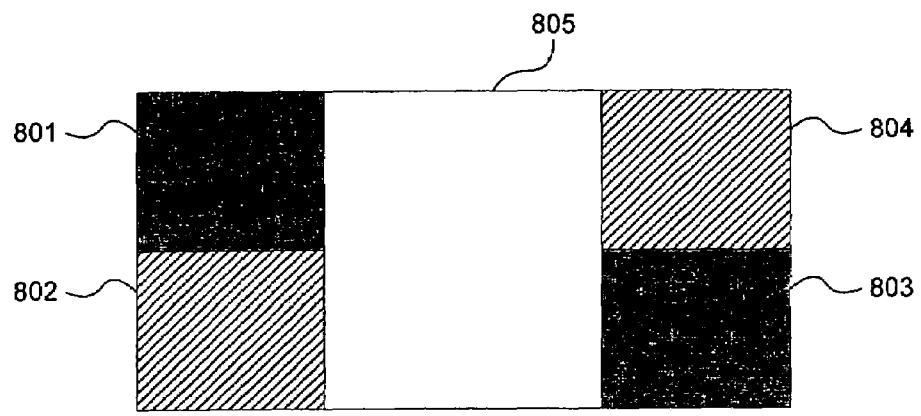

FIG. 8 illustrates one or many possible antisymmetric nanowire crossbars fabricated by connecting two nanowire-crossbar circuits via a nanowire-crossbar network.

Figure 9:
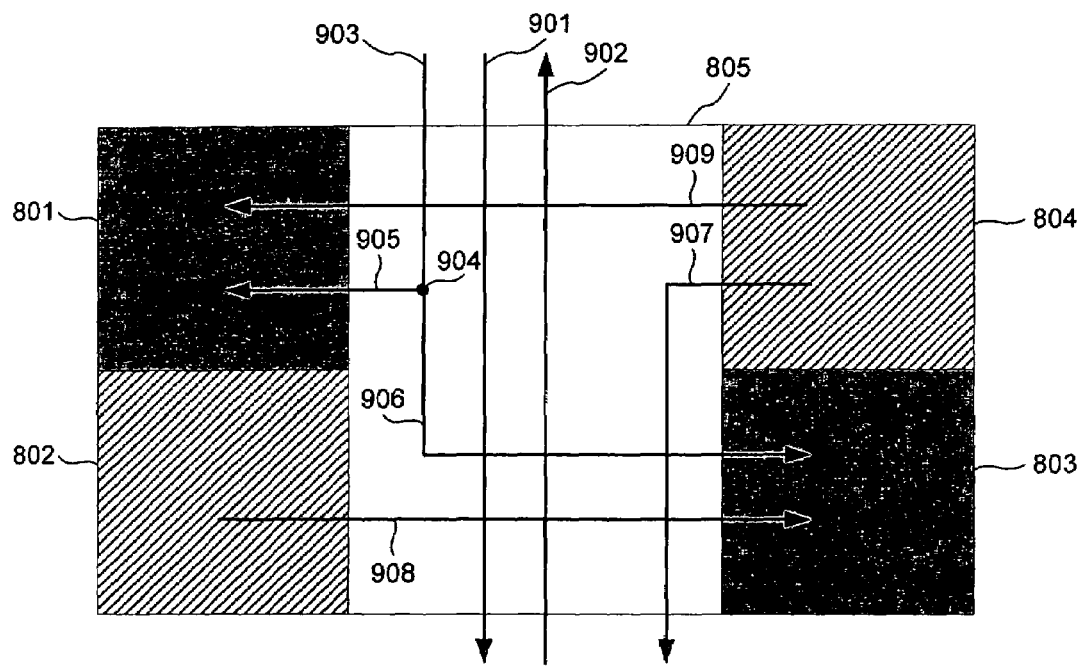

FIG. 9 illustrates four of many possible exemplary signal paths that can be taken by signals within the nanowire-crossbar network of the antisymmetric nanowire crossbar, that represents an embodiment of the present invention, shown in FIG. 8.

Figure 10:
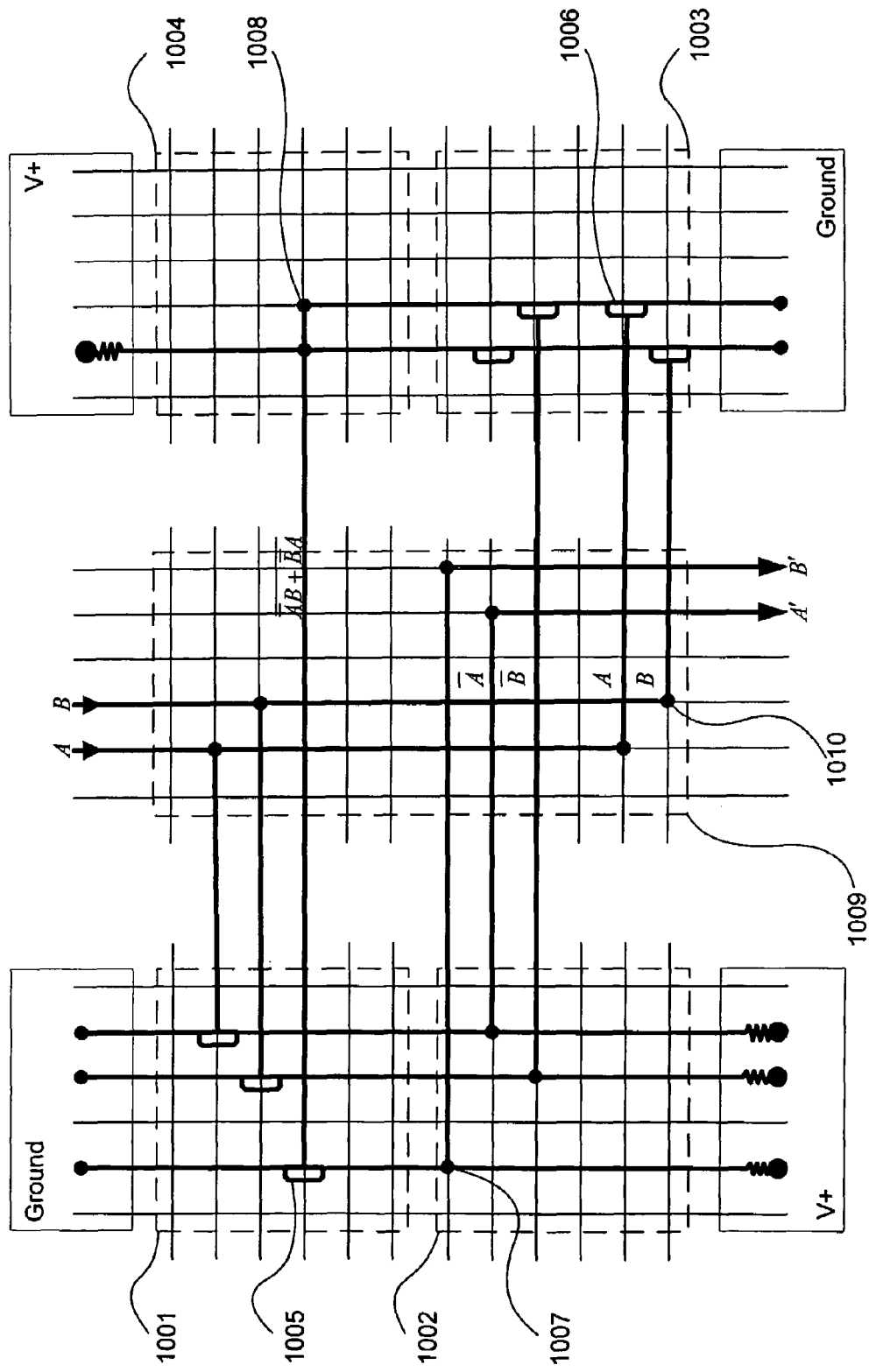

FIG. 10 illustrates an exemplary antisymmetric nanowire crossbar design, that represents an embodiment of the present invention, configured to implement a 2-bit incrementer.

Figure 11:
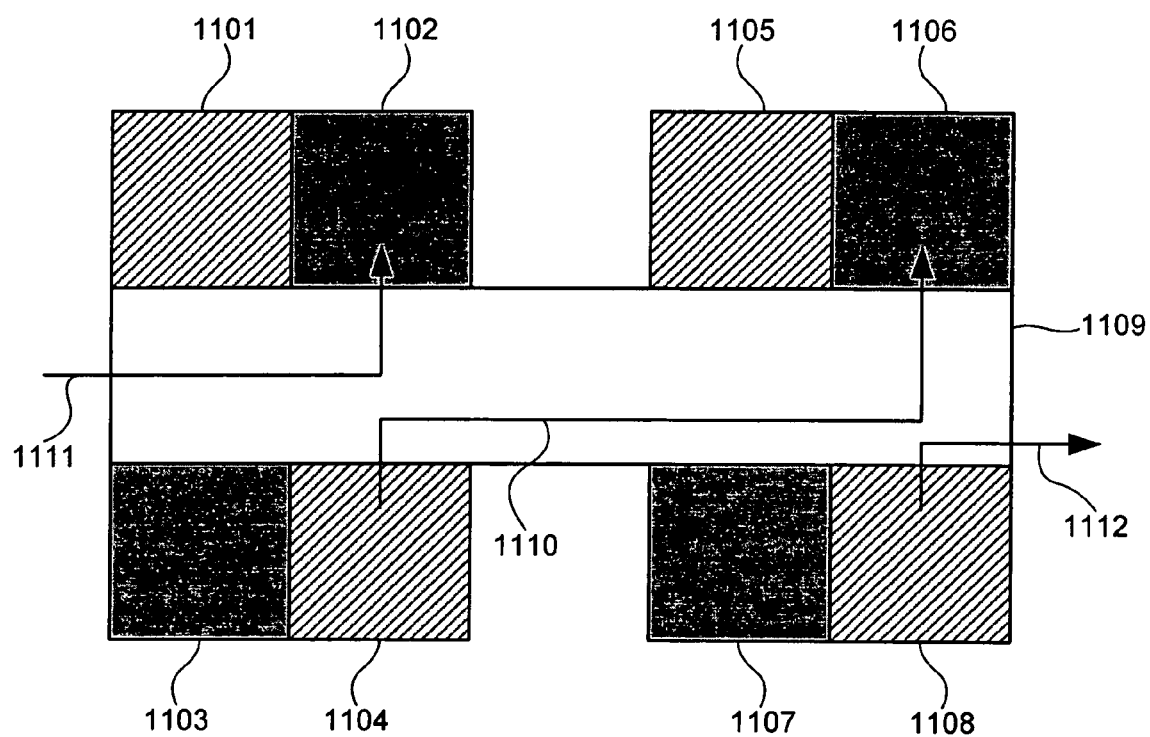

FIG. 11 illustrates two antisymmetric nanowire crossbars connected via a single nanowire-crossbar network that represents an embodiment of the present invention.

Figure 12:
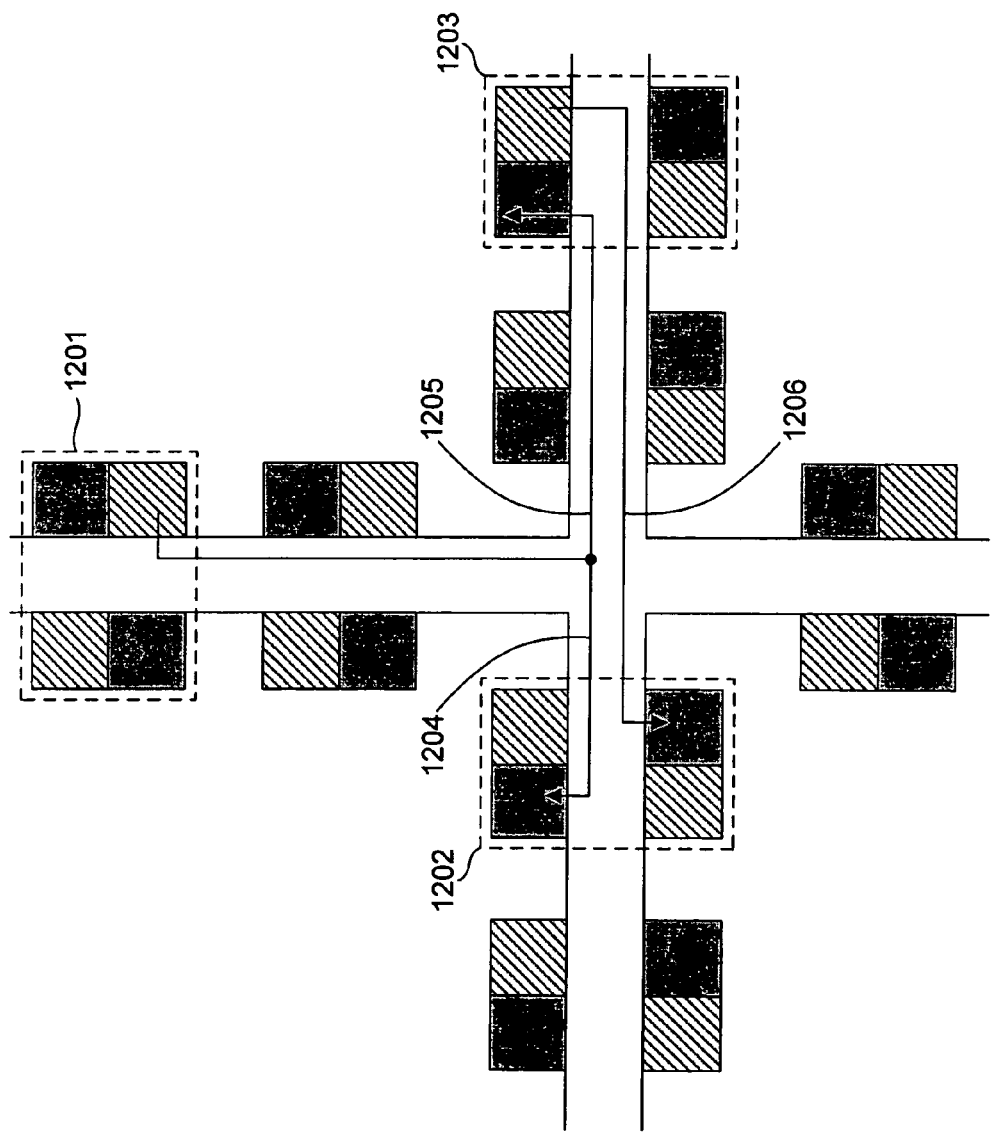

FIG. 12 illustrates one of many possible ways a plurality of antisymmetric nanowire crossbars can be arranged and connected via a branching nanowire-crossbar network that represents an embodiment of the present invention.

Figure 13:
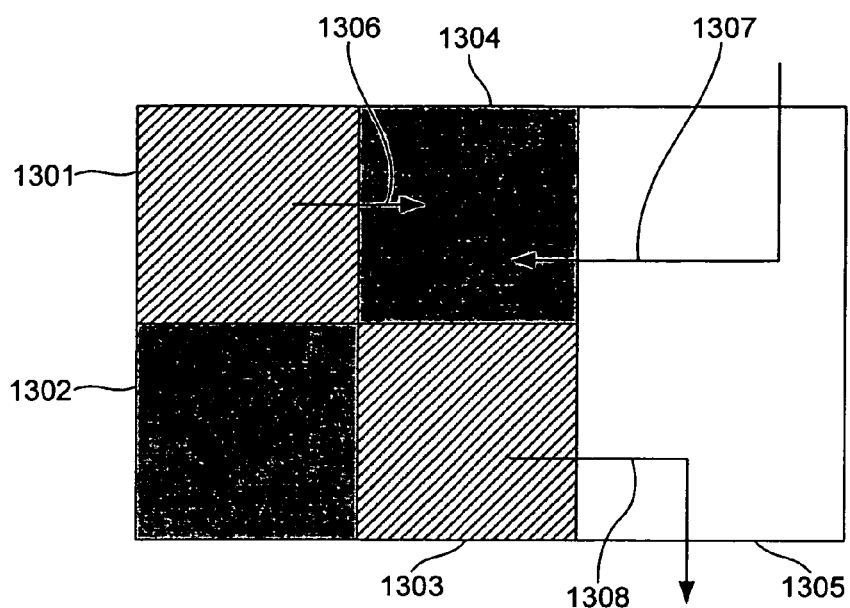

FIG. 13 illustrates one of many possible alternative arrangements of the antisymmetric nanowire crossbar that represents an embodiment of the present invention shown in FIG. 8.

Figure 14:
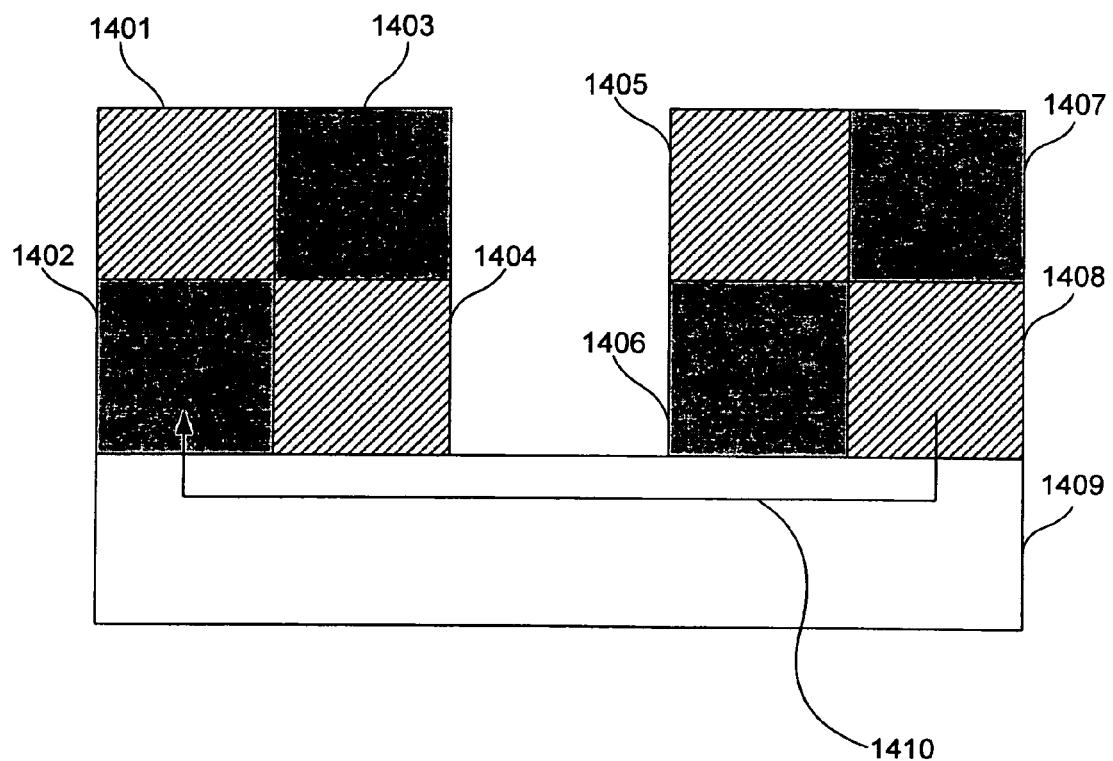

FIG. 14 illustrates two antisymmetric nanowire crossbars connected via a single nanowire-crossbar network that represents an embodiment of the present invention.

Figure 15A:
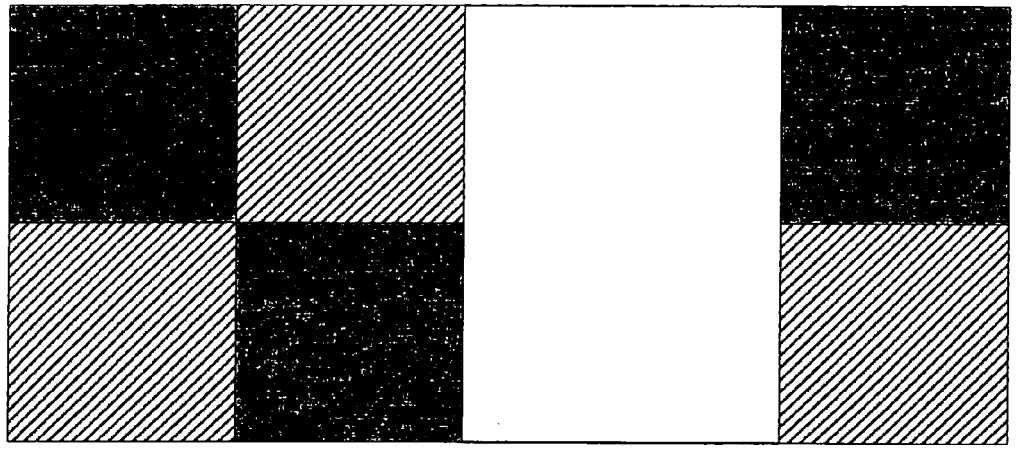
Figure 15B:
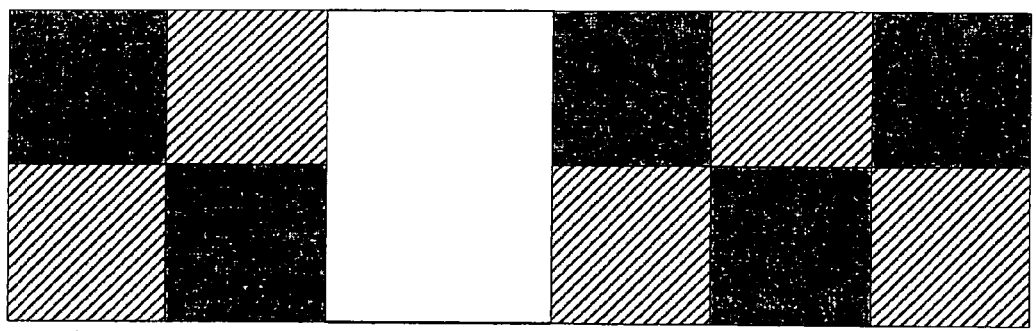

FIGS. 15A-15B illustrate two of many possible different arrangements of three or more nanowire-crossbar circuits and a single nanowire-crossbar network that represent embodiments of the present invention.

DETAILED DESCRIPTION OF THE INVENTION

As discussed below, nanowire crossbars can be used to fabricate nanoscale electronic circuits. Various embodiments of the present invention are directed to antisymmetric nanoscale-crossbar designs with reduced surface areas and reduced quantities of nanowire. The present invention is described below in the following two subsections: (1) nanowire crossbars, and (2) embodiments of the present invention.

Nanowire Crossbars

Figure 1:
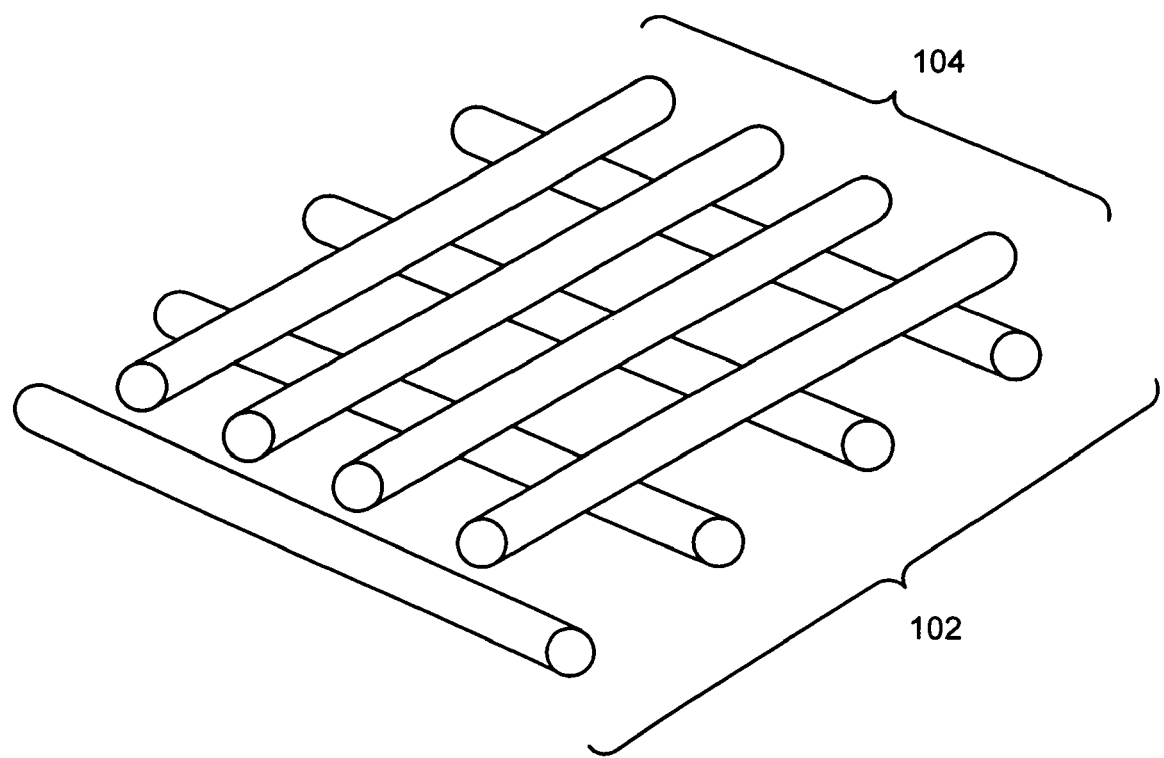
FIG. 1 illustrates a nanowire crossbar.

A relatively new and promising technology for manufacturing electronic devices involves nanowire crossbars. FIG. 1 illustrates a nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102, or nanowire junctions that represent the closest contact between two nanowires. Note that the term "nanowire crossbar" may refer to crossbars having one or more layers of sub-microscale, microscale, or larger wires in addition to nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale signal-line leads or other electronic leads through a variety of different methods to incorporate the nanowires into electrical circuits.

Figure 2:
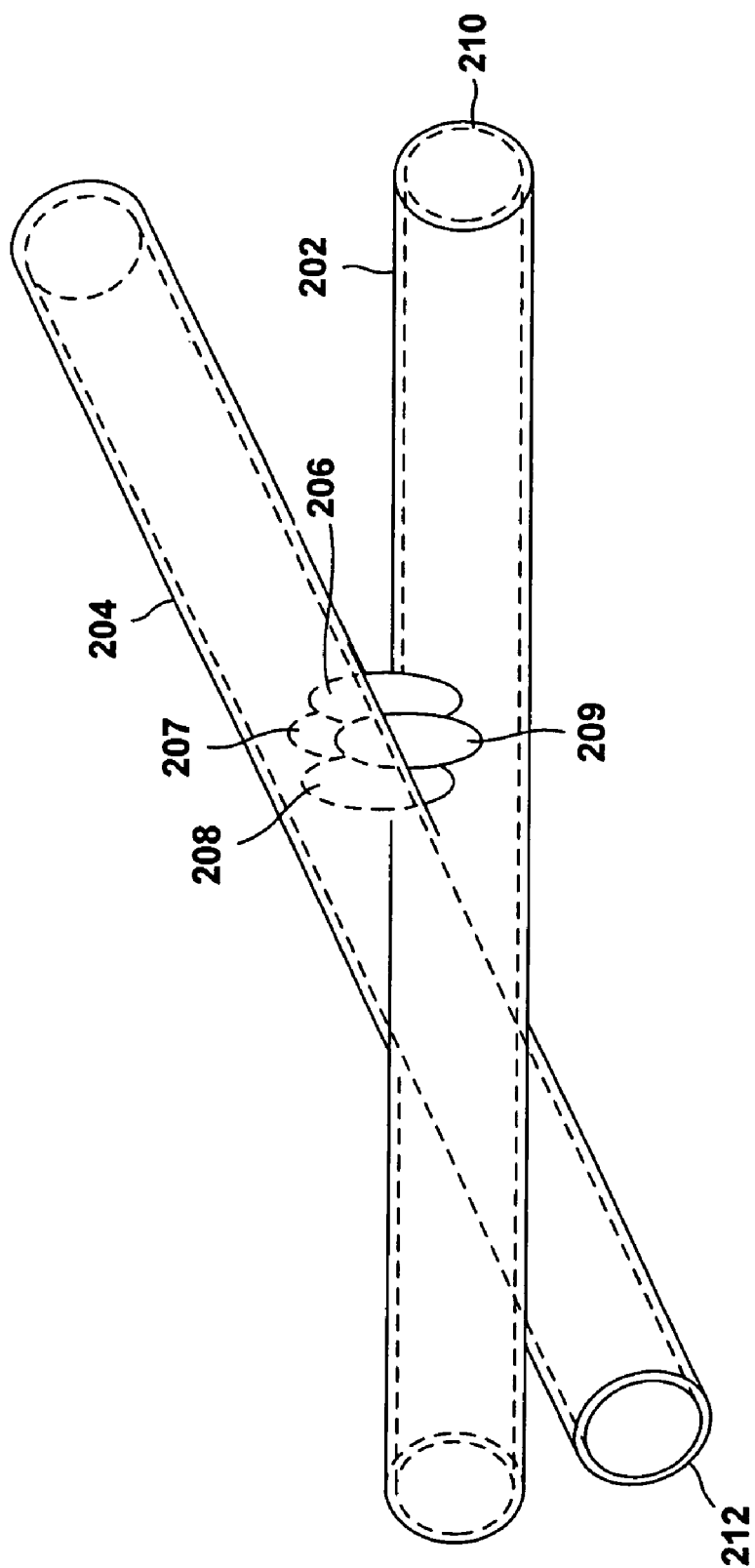
FIG. 2 illustrates a nanowire junction between two roughly orthogonal nanowires.

Nanowire crossbars may be used to create arrays of nanoscale electronic components, such as transistors, diodes, resistors, and other familiar basic electronic components. FIG. 2 illustrates a nanowire junction that interconnects nanowires 202 and 204 to two contiguous layers within a nanowire crossbar. Note that the nanowire junction may or may not involve physical contact between the two nanowires 202 and 204. As shown in FIG. 2, the two nanowires are not in physical contact at their overlap point, but the gap between them is spanned by a small number of molecules 206-209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires interconnected by a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire-junction molecules, and uniform orientation of the nanowire-junction molecule with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, and/or may serve as modulation-dopant-layers, which can be selectively activated to dope semiconductor nanowires. Both p-type and n-type modulation dopant coatings have been developed. In other applications, the molecules spanning nanowire junctions between overlapping nanowires may be introduced as a separate layer formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

One type of nanowire junction that can be configured behaves as if it were a resistor in series with a switch that may be opened or closed. When the switch is closed, the nanowire-junction molecule connects the overlapping nanowires at the nanowire junction. When the switch is open, the nanowire junction molecule spanning the nanowire junction has no effect on the current.

Nanowire junctions can be configured electrically, optically, mechanically or by other means. FIG. 3 illustrates one possible approach to configuring a network of reconfigurable nanoscale electrical components from a two-layer nanowire crossbar. In FIGS. 3A-3D, a small 3×3 nanowire crossbar is shown, with circles at all nine nanowire junctions that indicate the state of the nanowire-junction molecules. In one state, labeled "1" in FIGS. 3A-3D, the nanowire-junction molecules may have certain semiconductor, or conductive properties, while in a second state, labeled "2" in FIGS. 3A-3D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a write voltage, or configuring voltage, to the nanowires that form the nanowire junction in order to configure, or program, the nanowire junction to have the state "1." For example, in FIG. 3B, a first write voltage $v_w'$ is applied to horizontal nanowire 302 and a second write voltage $v_w''$ is applied to vertical nanowire 304 to change the state of the nanowire junction 306 from "2" to "1." Individual nanowire junctions may be configured through steps similar to the steps shown in FIG. 3B, resulting finally in a fully configured nanoscale component network as shown in FIG. 3C. Note that, in FIG. 3C, the states of nanowire junctions 306, 308, and 310, forming a downward-slanted diagonal through the nanowire crossbar have been configured by selective application of write voltages. Finally, as shown in FIG. 3D, the nanoscale electrical component network can be used as a portion of an integrated circuit. Input voltages $v_i'$, $v_i''$, and $v_i'''$ may be applied to the nanoscale electrical component lattice as inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the write voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
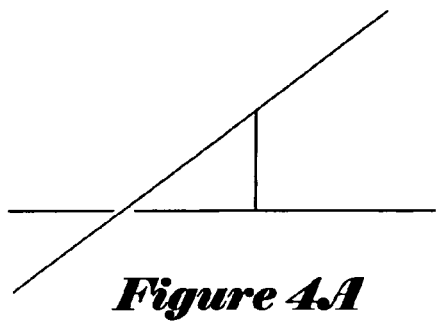
Figure 4B:
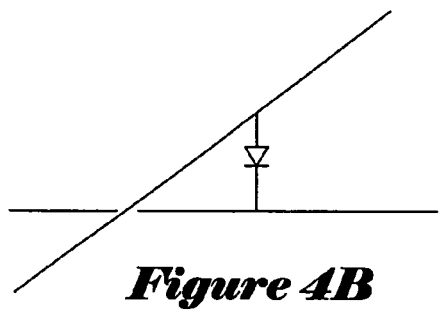
Figure 4C:
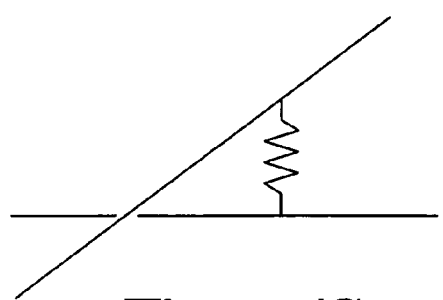
Figure 4D:
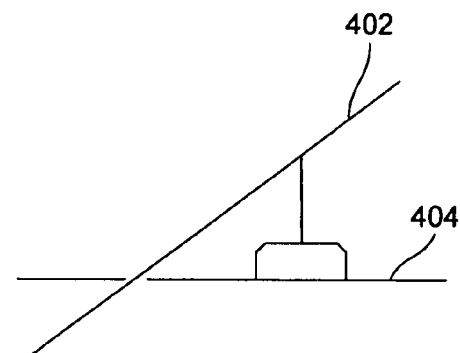
Figure 4E:
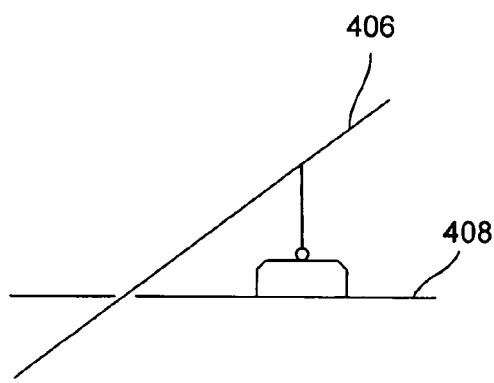
Figure 4F:
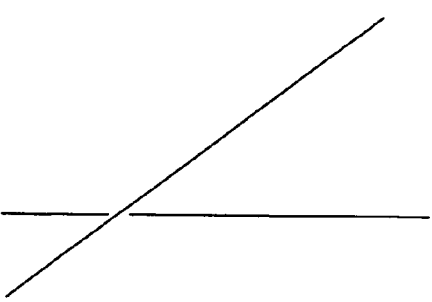

Nanowire junctions in nanowire crossbars may be configured, in various techniques depending on the chemical nature of the nanowires and nanowire-junction-spanning molecules, to form a wide variety of different, simple electronic components. FIG. 4 schematically illustrates a number of simple electrical components that can be configured at the nanowire junctions of nanowires in nanowire crossbars. A nanowire junction may represent (1) a simple conductive connection between two nanowires, as shown in FIG. 4A; (2) a diode that conducts current in only one direction between two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the overlapping of two conductive nanowires, with the voltage and current associated with each nanowire completely independent from one another, as shown in FIG. 4F.

The nFET and pFET nanowire junctions perform switch operations, controlled by the signal level placed on gate wires, that can either enable or disable source/drain wires. An enabled source/drain wire allows current to flow beyond the nFET or pFET nanowire junction, and the flow current beyond the nFET or pFET nanowire junction is not allowed in a disabled source/drain wire. However, nFETs and pFETs exhibit opposite behavior based on the signal level applied to the gate wires. In the case of the nFET, shown in FIG. 4D, a relatively low signal on the gate nanowire 402 causes the nFET to disable source/drain nanowire 404, while a relatively high signal on gate nanowire 402 causes nFET to enable source/drain nanowire 404. By contrast, in the case of the pFET, shown in FIG. 4E, a relatively low signal on gate nanowire 406 causes the pFET to enable source/drain nanowire 408, and a relatively high signal on gate nanowire 406 causes the pFET to disable source/drain nanowire 408. Note that a nanowire junction may also be configured as an insulator, essentially interrupting conduction at the nanowire junction with respect to both overlapping nanowires.

Thus, as discussed above with reference to FIGS. 1-4, a two-dimensional nanowire crossbar may be fabricated and then configured as a network of electrical components. Note also that a nanowire junction, although shown in FIGS. 4A-4F to comprise the nanowire junction of two single nanowires, may also comprise a number of nanowire junctions between a number of nanowires in a first layer of a nanowire crossbar that together comprise a single conductive element and the nanowires in a second nanowire layer that together comprise a second conductive element.

The configurable electrical resistances of nanowire junctions are important and special properties of certain types of nanowire junctions. When certain types of molecules are used for nanowire junctions, the initially relatively high resistances of the nanowire junctions may be lowered by applying relatively large positive voltages to the nanowire junctions. The resistances of the nanowire junctions may be a function of the magnitude of the highest voltages applied to the nanowire junction. By applying higher and higher positive voltages to a nanowire junction, the resistance of the nanowire junction may be made lower and lower. A relatively low resistivity state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Note that the signals input, output, and transmitted through nanowire crossbars are typically described in terms of detectable low or high physical quantities, such as voltage and current. The terms "low" and "high" generally refer to ranges of values. For example, a signal that ranges between no signal and a signal threshold maybe called a "low signal," and any signal above the signal threshold is called a "high signal." A low signal is represented by the bit value "0," and a high signal is represented by the bit value "1."

A particularly useful type of nanowire-crossbar circuit is the nanowire-crossbar-logic circuit. FIG. 5A illustrates an exemplary logic circuit that can be implemented by the nanowire-crossbar-logic circuits described below with reference to FIG. 6. In FIG. 5A, crossbar circuit 500 converts input signals A, B, and C into inverted output signal $\overline{AB+C}$. First, AND gate 501 accepts input signals A and B and produces a single output signal. The output signal is represented by the product AB, because an AND gate performs the Boolean algebra equivalent operation of multiplication on the inputs. Thus, if both input signals A and B are high, the output signal AB is high, and if either or both input signals A or B is low the output signal AB is low. Next, NOR gate 502 accepts the output signal AB from AND gate 501 and the input signal C. NOR gate 502 performs the Boolean algebra equivalent operation of addition and then inverts the result. Thus, NOR gate 502 produces the sum AB+C followed by an inversion operation to give the output $\overline{AB+C}$. For example, if either AB or C is high, then the output signal $\overline{AB+C}$ is low, and if both input signals AB and C are low, then the output signal $\overline{AB+C}$ is high. FIG. 5B illustrates a truth table that summarizes the logic operations performed by logic circuit 500 described above with reference to FIG. 5A.

FIG. 6 illustrates one of many possible exemplary nanowire-crossbar-logic circuits that can be used to implement the logic circuit shown in FIG. 5A. In FIG. 6, nanowire-crossbar-logic circuits are composed of a first layer of horizontal nanowires that overlap a second layer of vertical wires that can be of nanoscale, sub-microscale, microscale or larger dimensioned wires. The horizontal nanowires operate as gate electrodes that are typically made of metal or any other conductive material, and the vertical wires operate as the source/drain wires that are typically composed of a doped semiconductor. For example, the logic circuit in FIG. 6 is composed of two layers of parallel horizontal nanowires 601-612 that operate as gates and vertical wires 613-618 that operate as source/drain wires. Typically, nanowire-crossbar-logic circuits dedicate a set of nanowires to receiving input signals and a different set of nanowires to sending output signals. For example, in FIG. 6, the top set of horizontal nanowires 601-606 accept input signals, and the bottom set of horizontal nanowires 607-612 carry output signals.

Nanowire junctions can be selectively configured in the gaps between overlapping horizontal nanowires and vertical wires. For example, in FIG. 6, nanowire junction 619 is an nFET located between overlapping horizontal nanowire 605 and vertical wire 616. In general, because of the small scales of the nanowire-crossbar grids, it may be difficult to chemically alter individual nanowire junctions. Techniques exist for applying a very small number of molecules to a particular nanowire junction, but the techniques are painstakingly time consuming, and typically not suitable for mass production. However, it is currently relatively straightforward to chemically alter subregions or microregions, each comprising a number of nanowire junctions using currently available semiconductor manufacturing technologies. The term "microregion" is meant to indicate a scale larger than a single nanowire junction, but not necessarily a particular range of dimensions. For example, it is currently technically feasible to fabricate sub-micron-sized microregions. Microregions are identified in FIG. 6 by square regions demarcated by dashed-line enclosures. For example, in FIG. 6, dashed-line enclosures 620 and 621 demarcate two square microregions. Microregion 620 is composed of a chemical species that separates the first layer of horizontal nanowires 601-606 from the second layer of horizontal nanowires 613-618 and is chemically altered so that nanowire junctions within microregion 620 may be selectively configured as nFET components. Microregion 621 is composed of a chemical species that separates horizontal nanowires 607-612 from vertical wires 613-618 and is chemically altered so that nanowire junctions within microregion 621 may be selectively configured as conductive links. Note that the microregions illustrated in FIGS. 6 are the same size, and the dimensions are sharply defined. However, in practice, microregions often lack a clearly defined boundary due to difficulties in aligning micro-scale masks with defective nanowires located near the boundaries, and the size of each microregion can vary. Note also that in certain embodiments, the sets of horizontal wires may be nanoscale, sub-microscale, microscale, or of greater dimensions.

The nanowire-crossbar-logic circuit illustrated in FIG. 6 employs nFETs to implement the logic circuit shown in FIG. 5A. Note that the implementation of logic circuits is limited to nanowire-crossbar-logic circuits that employ nFETs alone. Nanowire-crossbar-logic circuits can be implemented by employing pFETs, resistors, diodes, and other electronic components, or any combination of electronic components at nanowire junctions. The nanowire-crossbar-logic circuit, described below with reference to FIG. 6, is intended to serve as an example and is, by no means, exhaustive of all possible nanowire-crossbar-logic-circuit designs and electrical components that can be used to implement the logic circuit describe above with reference to FIG. 5A. In FIG. 6, the input signals A, B, and C enter the logic circuit on horizontal nanowires 602, 604, and 605, respectively, and horizontal nanowire 609 carries the output signal $\overline{AB+C}$. Voltage source 622 supplies a high voltage on vertical wire 617 that can exit the nanowire-crossbar-logic circuit on horizontal nanowire 609. However, high-input signals A and B causes nFETs 623 and 624 to enable vertical wire 617 so that ground 625, via vertical wire 617, can pull the high output signal carried by horizontal nanowire 609 down to a low output signal. In addition, a high-input signal C causes nFET 619 to enable vertical wire 616 so that ground 625, via vertical wire 616, can pull the high output signal carried by horizontal nanowire 609 down to a low output signal. On the other hand, if either input signal A or input signal B is a low, nFETs 623 or 624 disable nanowire 617, and ground 625 is unable to pull down the high signal carried by horizontal nanowire 609. Moreover, if input signal C is low, nFET 619 disables nanowire 616, and ground 625 is unable to pull down the voltage level carried by horizontal nanowire 609. The nanowire-crossbar-logic circuit reproduces the output signals $\overline{AB+C}$ displayed in the table shown in FIG. 5B. For example, using the input signals given in row 503 of FIG. 5B, high-input signals applied to horizontal nanowires 602 and 604 cause nFETs 623 and 624 to enable vertical wire 617, and a low-input signal applied to horizontal nanowire 605 causes nFET 619 to disable vertical wire 616. Thus, ground 625 pulls down the signal carried by horizontal nanowire 609 via vertical wire 617 to a low signal represented by the output $\overline{AB+C}$ bit value "0."

EMBODIMENTS OF THE PRESENT INVENTION

Various embodiments of the present invention are directed to a type of nanowire crossbar referred to as an "antisymmetric nanowire crossbar." Antisymmetric nanowire crossbars are fabricated by combining two or more nanowire crossbars and a nanowire-crossbar network. An antisymmetric nanowire crossbar needs less routing circuitry than a functionally equivalent nanoscale electronic circuit that employs identical nanowire crossbars. Antisymmetric nanowire crossbars can be combined with other antisymmetric nanowire crossbars and other nanoscale components to fabricate larger computing structures.

The nanowire-crossbar circuits used to fabricate antisymmetric nanowire crossbars are composed of one or more microregions that receive input signals and one or more microregions that send output signals. For example, antisymmetric nanowire crossbars can be fabricated to implement complex logic circuits by arranging and combining nanowire-crossbar-logic circuits that perform simple logic operations, such as the nanowire-crossbar-logic circuits described above with reference to FIG. 6. Note that by combining nanowire-crossbar-logic circuits, larger antisymmetric nanowire crossbars can be fabricated to perform logical operations that are more complicated than operations that individual nanowire-crossbar-logic circuits can be designed to perform.

FIG. 7 illustrates a generalized nanowire-crossbar circuit. In FIG. 7, nanowire-crossbar circuit 701 is composed of microregion 702 that receives input signals and microregion 703 that sends output signals, and nanowire-crossbar circuit 704 is composed of two microregions that can receive input signals, microregions 705 and 706, and two microregions that send output signals, microregions 707 and 708. Arrows directed toward microregions, such as arrow 709, represent input signals, and arrows directed away from microregions, such as arrow 710, represent output signals.

A generalized nanowire-crossbar circuit is represented by box 711. Shaded region 712 represents those microregions employed to receive input signals, and hash-marked region 713 represents those microregions employed to send output signals to electronic devices located outside the nanowire crossbar. Note that the generalized nanowire-crossbar-circuit 711 is used in FIGS. 8-15 to accompany descriptions of the various design embodiments and descriptions of various features of the present invention.

In one embodiment, antisymmetric nanowire-crossbar-circuit devices are composed of a first nanowire-crossbar circuit connected to a second nanowire-crossbar circuit via a nanowire-crossbar network. The first and second nanowire-crossbar circuits are located on opposite sides of the nanowire-crossbar network so that the input microregion and output microregion of the first nanowire-crossbar circuit are opposite the output microregion and input microregion of the second nanowire-crossbar circuit, respectively. In other words, if the first and second nanowire-crossbar circuits initial lie in the same plane so that the input regions and output regions are opposite one another, the antisymmetric nanowire-crossbar circuit is determined by rotating the second nanowire-crossbar circuit 180 degrees about an axis perpendicular to the plane.

FIG. 8 illustrates one or many possible antisymmetric nanowire crossbars fabricated by connecting two nanowire-crossbar circuits via a nanowire-crossbar network. In FIG. 8, a first nanowire-crossbar circuit is identified by shaded region 801 and hash-marked region 802, and a second nanowire-crossbar circuit is identified by shaded region 803 and hash-marked region 804. Region 805 identifies a nanowire-crossbar network that connects the first nanowire-crossbar circuit and the second nanowire-crossbar circuit. Nanowire-crossbar network 805 is composed of a first layer of one or more approximately vertical parallel nanowires that overlaps a second layer of one or more approximately parallel horizontal nanowires. Note that, in FIG. 8, the antisymmetric nanowire crossbar is configured so that the first nanowire-crossbar-circuit-input microregion 801 is opposite the second nanowire-crossbar-circuit-output microregion 804, and the first nanowire-crossbar-circuit-output microregion 802 is opposite the second nanowire-crossbar-circuit-input microregion 803.

Typically, in order to increase computational efficiency, nanowire-crossbar circuits are organized according to the number of interconnections needed to link the nanowire-crossbar circuits together. For example, nanowire-crossbar circuits sharing a large number of interconnections are typically located closer together than are nanowire-crossbar circuits sharing fewer interconnections. In electronic circuit design, clustering electronic devices according to the number of interconnections is referred to as "Rent's Rule." Employing a nanowire-crossbar network to interconnect nanowire-crossbar circuits follows Rent's Rule, because the nanowire-crossbar network can be used to directly route signals between input and output microregions of the first and second nanowire-crossbar circuits. Short signal paths also reduce the electrical current propagation time needed to pass electrical signals between different nanowire-crossbar circuits.

Moreover, the nanowire-crossbar network can be employed to (1) route signals emanating from outside the antisymmetric nanowire crossbar through the antisymmetric nanowire crossbar without passing the signals to the internal nanowire-crossbar circuits, (2) route signals to one or more nanowire-crossbar circuits of the antisymmetric nanowire crossbar, and (3) route nanowire-crossbar circuit output signals to devices located outside the antisymmetric nanowire crossbar.

FIG. 9 illustrates four of many possible exemplary signal paths that can be taken by signals within nanowire-crossbar network 805 of the antisymmetric nanowire crossbar shown in FIG. 8. In FIG. 9, directed lines identify exemplary signal paths in nanowire-crossbar network 805. Signals sent along signal paths 901 and 902 pass through the antisymmetric nanowire crossbar without entering either the first nanowire-crossbar circuit or the second nanowire-crossbar circuit. A signal emanating from outside the antisymmetric nanowire crossbar enters nanowire-crossbar network 805 along signal path 903 and at conductive link 904 is split into a first signal and a second signal. The first signal follows signal path 905 to microregion 801, and the second signal follows signal path 906 to microregion 803. Signal path 907 passes signals output from microregion 804 to devices located outside the antisymmetric nanowire crossbar. Signal paths 908 and 909 identify signals passed between the first and second nanowire-crossbar circuits.

An exemplary antisymmetric nanowire crossbar is shown in FIG. 10. FIG. 10 illustrates an antisymmetric nanowire-crossbar design configured to implement a modulo 4, 2-bit incrementer. The input signal is a 2-bit number represented by (B,A), where A and B may have either bit values "0" or "1." The output signal (B', A') is a 2-bit number given by:

$$(B', A') = ((B, A)+1) \bmod 4$$

In FIG. 10, dashed lines demarcate four microregions 1001-1004 in the nanowire crossbar. Microregions 1001 and 1002 together compose a first nanowire-crossbar-logic circuit and microregions 1003 and 1004 together compose a second nanowire-crossbar-logic circuit. Microregions 1001 and 1003 are chemically altered so that nanowire junctions within microregions 1001 and 1003 can be selectively configured as nFET components. For example, components 1005 and 1006 represent nFET nanowire junctions. Microregions 1002 and 1004 are chemically altered so that nanowire junctions within microregions 1002 and 1004 can be selectively configured as conductive links that electrically connect overlapping nanowires. For example, components 1007 and 1008 represent conductive links located within microregions 1002 and 1004, respectively. Microregion 1009, demarcated by dashed lines, identifies the nanowire-crossbar network that connects the first nanowire-crossbar-logic circuit with the second nanowire-crossbar-logic circuit. Microregion 1009 is chemically altered so that conductive links, such as conductive link 1010, can be configured at certain overlapping nanowires. Note that microregion 1009 receives the input signals A and B, directs transmission of signals between the first and second nanowire-crossbar-logic circuits, and sends the output signals A' and B' to outside electronic devices. Note also that the modulo 4-incrementer follows Rent's Rule because there are fewer external input/output connections than input/output connections between the two nanowire-crossbar-logic circuits. For example, there are two signal paths that carry input signals A and B and output signals A' and B', which is less than the number of signal paths that pass signals between the first and second nanowire-crossbar-logic circuits.

Note that the present invention can be employed to connect separate individual nanowire-crossbar-circuit designs via a nanowire-crossbar network to produce larger, versatile antisymmetric nanowire crossbars designs that can be connected to other nanowire-crossbar circuits or to external devices. For example, the first and second nanowire-crossbar-logic circuits described above with reference to FIG. 10 can be designed or fabricated in advanced and connected via the nanowire-crossbar network to produce the modulo 4, 2-bit incrementer shown in FIG. 10. Moreover, the nanowire-crossbar network can be used to provide signal paths that allow either the first nanowire-crossbar-logic circuit or the second nanowire-crossbar-logic circuit alone to connect to other nanowire-crossbar-logic circuits, or to other external electronic devices, located outside the modulo 4, 2-bit incrementer. In other words, individual nanowire-crossbar circuits can be designed and/or fabricated separately, and the nanowire-crossbar network can be designed and/or fabricated separate from the nanowire-crossbar circuits to connect the individual nanowire-crossbar circuits and/or to provide signal paths to external devices.

In alternate embodiments, the nanowire-crossbar network can be extended to connect two or more antisymmetric nanowire crossbars. FIG. 11 illustrates two antisymmetric nanowire crossbars connected via a single nanowire-crossbar network. In FIG. 11, a first antisymmetric nanowire crossbar, comprising microregions 1101-1104, and a second antisymmetric nanowire crossbar, comprising microregions 1105-1108, are connected via nanowire-crossbar network 1109. Shaded regions, such as shaded region 1102, represent microregions that receive input signals, and hash-marked regions, such as hash marked region 1105, represent microregions that send signals. Nanowire-crossbar network 1109 provides a means for (1) routing signals between the first antisymmetric nanowire crossbar and the second antisymmetric nanowire crossbar, (2) receiving signals from outside the two antisymmetric nanowire crossbars, and (3) sending signals to devices located outside the two antisymmetric nanowire crossbars. For example, directed line 1110 represents a signal path for transmission of signals from microregion 1104 of the first antisymmetric nanowire crossbar to microregion 1106 of the second antisymmetric nanowire crossbar. Directed line 1111 represents a signal path for receiving signals by microregion 1102 from a device located outside the two antisymmetric nanowire crossbars, and directed line 1112 represents a signal path for sending signals from microregion 1108 to a device located outside the two antisymmetric nanowire crossbars.

In alternate embodiments, the nanowire-crossbar network can be extended and branched to connect a plurality of antisymmetric nanowire crossbars. FIG. 12 illustrates one of many possible ways a plurality of antisymmetric nanowire crossbars can be arranged and connected via a branching nanowire-crossbar network. In FIG. 12, an exemplary branching nanowire-crossbar network 1201 can be used to path signals between two or more antisymmetric nanowire crossbars. For example, antisymmetric nanowire crossbar 1202 can send signals to antisymmetric nanowire crossbars 1203 and 1204 via signal paths 1205 and 1206, and antisymmetric nanowire crossbar 1204 can send signals to antisymmetric nanowire crossbar 1203 via signal path 1207. Note that nanowire-crossbar network 1201 can also be configured to pass signals to and from outside electronic devices.

Certain generalized relationships between the components of the antisymmetric nanowire crossbar are necessary for antisymmetric nanowire crossbar functionality. Moreover, particular antisymmetric nanowire crossbar layouts or geometries are not necessary for antisymmetric nanowire crossbar functionality. Thus, in alternate embodiments, the internal nanowire-crossbar circuits of an antisymmetric nanowire crossbar, such as the antisymmetric nanowire crossbar shown in FIG. 8, can be rearranged in various configurations without loss of functionality. FIG. 13 illustrates one of many possible alternative arrangements of the antisymmetric nanowire crossbar shown in FIG. 8. In FIG. 13, a first nanowire-crossbar circuit is composed of microregions 1301 and 1302, and a second nanowire-crossbar circuit is composed of microregions 1303 and 1304. Note that the input and output microregions of the first nanowire-crossbar circuit are adjacent to output and input microregions of the second nanowire-crossbar circuit. For example, input microregion 1304 is adjacent to output microregion 1301, and output microregion 1303 is adjacent to input microregion 1302. The inverted arrangement of adjacent nanowire-crossbar circuits allows for the direct transmission of signals between the crossbar-logic-circuit microregions. For example, signals output from microregion 1301 of the first nanowire-crossbar circuit can be sent directly to microregion 1304, as indicated by signal path 1306. Nanowire-crossbar network 1305 can be used to path signals between the second nanowire-crossbar circuit and other devices located outside the antisymmetric nanowire crossbar. For example, a signal entering the antisymmetric nanowire crossbar can follow signal path 1307 to input microregion 1304, and a output signal to devices located outside the antisymmetric nanowire crossbar can follow signal path 1308.

In alternate embodiments, two or more antisymmetric nanowire crossbar configurations, as described above with reference to FIG. 13, can be combined with other antisymmetric nanowire crossbars by extending the nanowire-crossbar network 1305. FIG. 14 illustrates two antisymmetric nanowire crossbars connected via a single nanowire-crossbar network that represents an embodiment of the present invention. In FIG. 14, a first antisymmetric nanowire crossbar is composed of microregions 1401-1404, and a second antisymmetric nanowire crossbar is composed of microregions 1405-1408. Both the first antisymmetric nanowire crossbar and the second antisymmetric nanowire crossbar include a portion of nanowire-crossbar network 1409. Nanowire-crossbar network 1409 provides signal paths for passing signals between the first antisymmetric nanowire crossbar and the second antisymmetric nanowire crossbar. For example, directed line 1410 represents one of many possible signal paths a signal leaving output microregion 1408 can follow to reach input microregion 1402.

Note that the nanowire-crossbar network described above with reference to FIG. 14 can be branched and extended, as described above with reference to FIG. 12, to include an almost limitless number of different possible antisymmetric nanowire crossbar arrangements and connections.

Although the present invention has been described in terms of several embodiments, it is not intended that the invention be limited to the above described embodiments. Modifications within the spirit of the invention will be apparent to those skilled in the art. For example, in alternate embodiments, FIGS. 15A-15B illustrate two of many possible antisymmetric nanowire crossbars that can be fabricated by combining a plurality of nanowire-crossbar circuits via a single nanowire-crossbar network. Those skilled in the art will readily recognize that the present invention can be used with nanowire crossbars that employ diodes and resistors at nanowire junctions.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. An antisymmetric nanowire crossbar comprising:
   two or more nanowire-crossbar circuits, each nanowire-crossbar circuit having one or more microregions configured to receive input signals and one or more microregions configured to send output signals; and
   a nanowire-crossbar network that provides signal paths between one or more of the microregions that send output signals to one or more of the microregions that receive input signals and that provides signal paths to external electronic devices.

2. The antisymmetric nanowire crossbar of claim 1 wherein the one or more microregions each further comprises a first layer of approximately parallel horizontal nanowires that overlaps a second layer of approximately parallel vertical wires.

3. The antisymmetric nanowire crossbar of claim 2 wherein the first layer of approximately parallel horizontal nanowires is approximately orthogonal to the second layer of approximately parallel nanowires.

4. The antisymmetric nanowire crossbar of claim 2 wherein the first layer of approximately parallel horizontal nanowires receives input signals and sends output signals.

5. The antisymmetric nanowire crossbar of claim 1 wherein the microregions each further comprises selectively configured nanowire junctions located between overlapping horizontal wires and vertical wires.

6. The antisymmetric nanowire crossbar of claim 5 wherein the nanowire junctions each further comprises selectively configured nanowire-junction molecules configured as diodes, transistors, resistors, or conductive links.

7. The antisymmetric nanowire crossbar of claim 1 wherein the nanowire-crossbar network further comprises a first layer of approximately parallel horizontal nanowires that overlaps a second layer of approximately parallel vertical wires.

8. The antisymmetric nanowire crossbar of claim 1 wherein the nanowire-crossbar network further comprises signal paths to pass signals between one or more of the microregions that send output signals and one or more of the microregions that receive input signals and to pass signals to and from one or more external electronic devices.

* * * * *